United States Patent
Flewelling

(10) Patent No.: US 11,405,003 B1
(45) Date of Patent: Aug. 2, 2022

(54) EXTENDED FEEDBACK GAIN TUNING IN TIA BASED CURRENT AMPLIFIER OR MIXER

(71) Applicant: BAE SYSTEMS Information and Electronic Systems Integration Inc., Nashua, NH (US)

(72) Inventor: Gregory M. Flewelling, Freeport, ME (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 102 days.

(21) Appl. No.: 17/003,107

(22) Filed: Aug. 26, 2020

(51) Int. Cl.
  H03F 1/26 (2006.01)
  H03F 3/08 (2006.01)
  H03F 3/45 (2006.01)
  H04B 10/40 (2013.01)
  H03G 3/30 (2006.01)

(52) U.S. Cl.
  CPC ............... *H03F 1/26* (2013.01); *H03F 3/082* (2013.01); *H03F 3/45475* (2013.01); *H03G 3/3063* (2013.01); *H04B 10/40* (2013.01)

(58) Field of Classification Search
  CPC ........................................................ H03F 1/26
  See application file for complete search history.

(56) References Cited

U.S. PATENT DOCUMENTS

| | | | | |
|---|---|---|---|---|
| 5,039,952 A * | 8/1991 | Dreps | ................. | H03G 1/0023 330/252 |
| 5,345,073 A * | 9/1994 | Chang | ....................... | H03F 3/08 250/214 A |
| 8,089,309 B2 | 1/2012 | Jansen et al. | | |
| 10,833,643 B1 * | 11/2020 | Broekaert | ................ | H03G 1/02 |
| 2004/0056728 A1 * | 3/2004 | Dent | ...................... | H03B 5/366 331/158 |
| 2009/0191833 A1 * | 7/2009 | Kaczman | ............ | H03F 3/45183 455/296 |
| 2009/0202022 A1 * | 8/2009 | Kaczman | ............ | H04L 27/3863 375/317 |
| 2013/0057348 A1 * | 3/2013 | Proesel | ..................... | H03F 3/08 330/291 |

* cited by examiner

*Primary Examiner* — Patricia T Nguyen
(74) *Attorney, Agent, or Firm* — Maine Cernota & Rardin; Scott J. Asmus

(57) ABSTRACT

A transimpedance amplifier (TIA) device design is disclosed. Symmetric components include first and second resistors $R_i$, $R_{fb}$, $R_e$, $R_m$, $R_x$, $R_c$, and $R_l$, and transistors Q1-Q4. An optional mixer or cascode adds transistors Q5-Q8. Values for resistor components $R_x$ provide extended feedback gain tuning in a TIA-based current amplifier or mixer implementations without greatly affecting the input impedance or requiring more attenuators. Example values for resistor components $R_x$ range from about 50 to about 350 ohms.

20 Claims, 6 Drawing Sheets

300

EMBODIMENT SCEMATIC WITHOUT MIXER OR CASCODE

PRIOR ART SCHEMATIC

EMBODIMENT SCEMATIC WITH MIXER OR CASCODE

EMBODIMENT SCEMATIC WITHOUT MIXER OR CASCODE

400

| Re | Ri | Rfb | Rm | Rx | Rl | Old Gain (Linear) | New Gain (Linear) | Old Gain (dB) | New Gain (dB) |
|---|---|---|---|---|---|---|---|---|---|
| 100 | 35 | 50 | 500 | - | 50 | 1.142857 | 1.142857 | 1.159839 | 1.159839 |
| 100 | 35 | 75 | 500 | 150 | 50 | 1.357143 | 1.714286 | 2.652511 | 4.681664 |
| 100 | 35 | 100 | 500 | 100 | 50 | 1.571429 | 2.285714 | 3.925893 | 7.180439 |
| 100 | 35 | 125 | 500 | 83.33333 | 50 | 1.785714 | 2.857143 | 5.036239 | 9.118639 |
| 100 | 35 | 150 | 500 | 75 | 50 | 2 | 3.428571 | 6.0206 | 10.70226 |
| 100 | 35 | 175 | 500 | 70 | 50 | 2.214286 | 4 | 6.904673 | 12.0412 |
| 100 | 35 | 200 | 500 | 66.66667 | 50 | 2.428571 | 4.571429 | 7.707018 | 13.20104 |
| 100 | 35 | 225 | 500 | 64.28571 | 50 | 2.642857 | 5.142857 | 8.441474 | 14.22409 |
| 100 | 35 | 250 | 500 | 62.5 | 50 | 2.857143 | 5.714286 | 9.118639 | 15.13924 |
| 100 | 35 | 275 | 500 | 61.11111 | 50 | 3.071429 | 6.285714 | 9.746808 | 15.96709 |
| 100 | 35 | 300 | 500 | 60 | 50 | 3.285714 | 6.857143 | 10.3326 | 16.72286 |
| 100 | 35 | 325 | 500 | 59.09091 | 50 | 3.5 | 7.428571 | 10.88136 | 17.41811 |
| 100 | 35 | 350 | 500 | 58.33333 | 50 | 3.714286 | 8 | 11.39751 | 18.0618 |

GAIN AS A FUNCTION OF RESISTOR VALUES
FIGURE 4

SAMPLE GAIN VS. FEEDBACK RESISTOR VALUE

600

PRIOR ART 605  EMBODIMENT 610

GAIN CHART dB

US 11,405,003 B1

EXTENDED FEEDBACK GAIN TUNING IN TIA BASED CURRENT AMPLIFIER OR MIXER

STATEMENT OF GOVERNMENT INTEREST

This invention was made with government support under a classified contract number awarded by a classified agency. The United States Government has certain rights in the inventions.

FIELD

This disclosure relates to transimpedance amplifiers (TIAs), more particularly, to extended feedback gain tuning in a TIA-based current amplifier or mixer.

BACKGROUND

When attempting to optimize a transimpedance amplifier, each component and variable interacts. As a consequence, whenever calculating response and noise, the change of any factor may change the computations considerably. A simple or obvious way to compute or optimize performance does not exist. Particularly, performance such as response and bandwidth, peaking or overshoot, and noise or SNR, is an extremely complicated, nonlinear, and highly interacting function of many components. These components include the feedback resistor, source capacitance, feedback capacitance, bandwidth, gain factor, voltage noise of the transistors, current noise of the transistors, input capacitances of the transistors, and gain-bandwidth product of the transistors.

To adjust the gain in a TransImpedance Amplifier (TIA)-based amplifier or mixer without greatly affecting the input impedance, the feedback resistor can be adjusted by switching in different resistors. However, due to the way gain is derived in the amplifier, the adjustment is limited in its effect because the feedback resistor appears in multiple places in the transfer function, both increasing and decreasing the gain.

The only other solutions have been to either change a different resistance value, or to live with the limited gain adjustment range. However, changing a different resistor value either modifies the input impedance, or has its own limitations on how much it can affect the gain. If gain adjustment range is limited, the system may require more attenuators in other locations.

What is needed is a device and system to adjust the gain in a Transimpedance Amplifier-based amplifier or mixer without greatly affecting the input impedance or requiring more attenuators.

SUMMARY

An embodiment provides a transimpedance amplifier device comprising a first circuit half and a second circuit half; the first circuit half comprising a first $R_i$ resistor in electrical connection with a base of a transistor Q1 and a first $R_{fb}$ resistor; the first $R_{fb}$ resistor in electrical connection with a first $R_e$ resistor, a first $R_m$ resistor, a first $R_x$ resistor, and an emitter of a transistor Q2, the first $R_e$ resistor is also in electrical connection with a ground, an emitter of the transistor Q1 is also in electrical connection with the ground, a collector of the transistor Q1 is in electrical connection with a base of the transistor Q2 and a first $R_c$ resistor, first $R_c$ resistor is also in electrical connection with a first $R_l$ resistor, a collector of the transistor Q2 is in electrical communication with the end of the first $R_l$ resistor opposite the end in electrical communication with the first $R_c$ resistor; the second circuit half comprising a second $R_i$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, the second $R_e$ resistor is also in electrical connection with the ground, an emitter of a transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor, a collector of the transistor Q3 is in electrical communication with the end of the second $R_l$ resistor opposite the end in electrical communication with the second $R_c$ resistor; wherein a second $R_i$ resistor in electrical connection with a base of the transistor Q4 and a second $R_{fb}$ resistor, the second $R_{fb}$ resistor is in electrical connection with a second $R_e$ resistor, a second $R_m$ resistor, a second $R_x$ resistor, and an emitter of the transistor Q3, the second $R_e$ resistor is also in electrical connection with the ground, emitter of the transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor; and the first half and the second half are in electrical communication between the first $R_x$ resistor and the second $R_x$ resistor, and between the first $R_m$ resistor, and the second $R_m$ resistor. In embodiments the gain is defined as $$\frac{V_o}{V_i} = \frac{Rfb * Rl}{R_i} * (S_e + S_m + S_{fbmax}).$$

In other embodiments, duplicating and inverting a gain-calculation resistance value by the first and second $R_x$ resistors located between the first and second $R_i$ resistors counteracts effects of response, bandwidth, peaking, overshoot, noise, and SNR variables; adjusts gain affecting an input impedance by less than about 10%; and does not include additional attenuators. In subsequent embodiments the device is a component of a transceiver. For additional embodiments the device is a component of a narrow band chipset. In another embodiment, a resistance value of at least one of the first $R_x$ resistor and the second $R_x$ resistor is about 60 ohms. For a following embodiment a value of each of the first and the second resistors $R_{fb}$ is about 350 ohms. In subsequent embodiments further comprises a mixer. In additional embodiments the transistors are implemented with CMOS FETs or bipolar junction transistors.

Another embodiment provides a transimpedance amplifier device comprising a first circuit half, a second circuit half, and a mixer; the first circuit half comprising a first $R_i$ resistor in electrical connection with a base of a transistor Q1 and a first $R_{fb}$ resistor; the first $R_{fb}$ resistor in electrical connection with a first $R_e$ resistor, a first $R_m$ resistor, a first $R_x$ resistor, and an emitter of a transistor Q2, the first $R_e$ resistor is also in electrical connection with a ground, an emitter of the transistor Q1 is also in electrical connection with the ground, a collector of the transistor Q1 is in electrical connection with a base of the transistor Q2 and a first $R_c$ resistor, first $R_c$ resistor is also in electrical connection with a first $R_l$ resistor; the second circuit half comprising a second $R_i$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, the second $R_e$ resistor is also in electrical connection with the ground, an emitter of a transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor; wherein a second $R_l$ resistor in electrical connection with a base of the transistor Q4 and a second $R_{fb}$ resistor, the second $R_{fb}$ resistor is in electrical connection with a second $R_e$ resistor, a second $R_m$ resistor, a second $R_x$ resistor, and an emitter of the transistor Q3, the second $R_e$ resistor is also in electrical connection with the ground, emitter of the transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor; and the mixer comprising transistors Q5, Q6, Q7, and Q8, wherein a base of the transistor Q6 and a base of the transistor Q7, a base of the transistor Q5 and a base of the transistor Q8, a collector of the transistor Q6 and a collector of the transistor Q8, and a collector of the transistor Q5 and a collector of the transistor Q7, a collector of the transistor Q3 is in electrical communication with an emitter of the transistor Q8 and with an emitter of the transistor Q7, a collector of the transistor Q7 is also in electrical communication with the second $R_l$ resistor, opposite the end in electrical connection with the second $R_c$ resistor. In included embodiments the gain is defined as:

$$\frac{V_o}{V_i} = \frac{0.5 * Rfb * Rl}{R_i} * (S_e + S_m + S_{fbmax}).$$

In yet further embodiments duplicating and inverting a gain-calculation resistance value by the first and second $R_x$ resistors located between the first and second $R_i$ resistors counteracts effects of response, bandwidth, peaking, overshoot, noise, and SNR variables; adjusts gain affecting an input impedance by less than about 10%; and does not require additional attenuators. In related embodiments the device is a component of a heterodyne or homodyne transceiver. For further embodiments the device is a component of a wideband or a narrowband transceiver. In ensuing embodiments a resistance value of each of the first and the second $R_e$ resistors is about 100 ohms; a resistance value of each of the first and the second $R_i$ resistors is about 35 ohms; a resistance value of each of the first and the second $R_{fb}$ resistors is about 75 ohms; a resistance value of each of the first and the second $R_m$ resistors is about 500 ohms; a resistance value of each of the first and the second $R_x$ resistors is about 150 ohms; and a resistance value of each of the first and the second $R_l$ resistors is about 50 ohms. For yet further embodiments, a resistance value of each of the first and the second $R_{fb}$ resistors is about 350 ohms. For more embodiments, a resistance value of each of the first and the second $R_x$ resistors is about 150 ohms. Continued embodiments include the transistors are implemented with CMOS FETs or bipolar junction transistors. For additional embodiments, the gain is doubled by increasing a value of each of the first and the second $R_{fb}$ resistors from about 50 ohms to about 350 ohms.

A yet further embodiment provides a transimpedance amplifier device comprising a first circuit half, a second circuit half, and a cascode; the first circuit half comprising a first $R_i$ resistor in electrical connection with a base of a transistor Q1 and a first $R_{fb}$ resistor; the first $R_{fb}$ resistor in electrical connection with a first $R_e$ resistor, a first $R_m$ resistor, a first $R_x$ resistor, and an emitter of a transistor Q2, the first $R_e$ resistor is also in electrical connection with a ground, an emitter of the transistor Q1 is also in electrical connection with the ground, a collector of the transistor Q1 is in electrical connection with a base of the transistor Q2 and a first $R_c$ resistor, first $R_c$ resistor is also in electrical connection with a first $R_l$ resistor; the second circuit half comprising a second $R_i$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, the second $R_e$ resistor is also in electrical connection with the ground, an emitter of a transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor; wherein a second $R_l$ resistor in electrical connection with a base of the transistor Q4 and a second $R_{fb}$ resistor, the second $R_{fb}$ resistor is in electrical connection with a second $R_e$ resistor, a second $R_m$ resistor, a second $R_x$ resistor, and an emitter of the transistor Q3, the second $R_e$ resistor is also in electrical connection with the ground, emitter of the transistor Q4 is also in electrical connection with the ground, a collector of the transistor Q4 is in electrical connection with a base of the transistor Q3 and a second $R_c$ resistor, the second $R_c$ resistor is also in electrical connection with a second $R_l$ resistor; and the cascode comprising transistors Q5, Q6, Q7, and Q8, wherein a base of the transistor Q6 and a base of the transistor Q7, a base of the transistor Q5 and a base of the transistor Q8, a collector of the transistor Q6 and a collector of the transistor Q8, and a collector of the transistor Q5 and a collector of the transistor Q7, a collector of the transistor Q3 is in electrical communication with an emitter of the transistor Q8 and with an emitter of the transistor Q7, a collector of the transistor Q7 is also in electrical communication with the second $R_l$ resistor, opposite the end in electrical connection with the second $R_c$ resistor.

BRIEF DESCRIPTION OF THE DRAWINGS

FIG. 4 is a table presenting gain as a function of resistor values in accordance with an embodiment.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The invention is susceptible of many embodiments. What follows is illustrative, but not exhaustive, of the scope of the invention.

Figure 1:
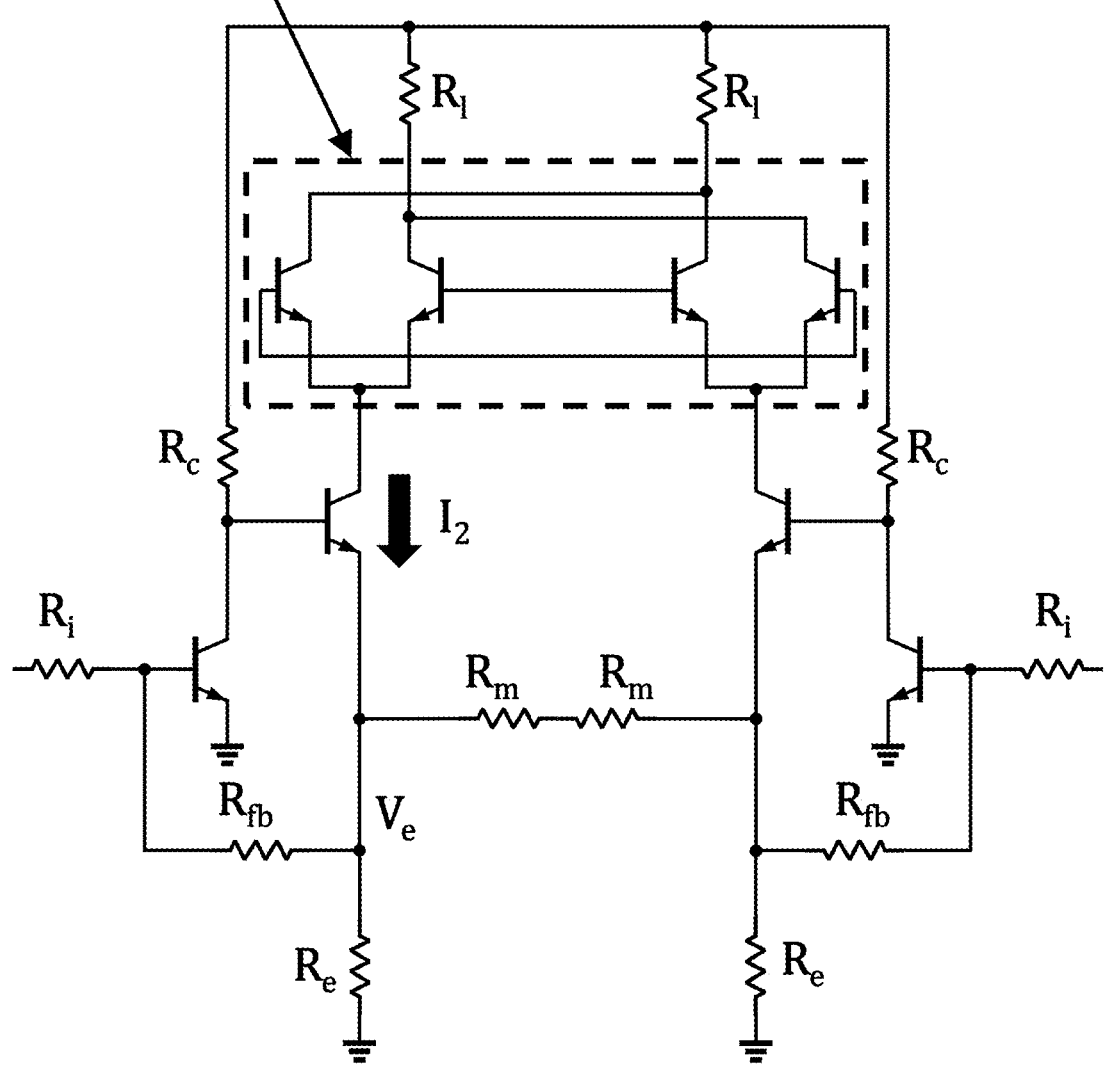
FIG. 1 is a schematic depicting a conventional transimpedance amplifier.

FIG. 1 is a schematic 100 depicting the components that determine the gain for a prior art TIA. Included is an optional mixer or cascode 105. Equations for gain calculation include:

$$V_e = \frac{R_{fb}}{R_i} * V_i \quad (EQ1)$$

and $$I_2 = V_e * \left(\frac{1}{R_e} + \frac{1}{R_m} + \frac{1}{R_{fb}}\right) = \frac{R_{fb}}{R_i} * (S_e + S_m + S_{fb}) \quad (EQ2)$$

and $$V_o = 0.5 * I_2 * R_l \quad (EQ3)$$

and Gain equals:

$$\frac{V_o}{V_i} = \frac{0.5 * Rfb * Rl}{R_i} * (S_e + S_m + S_{fb}) \quad (EQ4)$$

where the values of 0.5 in Equations 3 and 4 represent the contribution of an optional mixer. The mixer splits the energy in half, sending half to one sideband frequency, and the other half to another sideband. The cascode preserves the energy, and is used to improve the output impedance.

As introduced in the Background, when attempting to optimize a transimpedance amplifier, each component and variable interacts. Specifically, varying $R_l$ or $R_e$ significantly varies bias points. Varying $R_i$ hurts the noise figure, and changes the input match significantly. The range to vary $R_m$ is actually small. Varying $R_{fb}$ is good for performance, but varies two parts of the equation, diminishing its effect.

Figure 2:
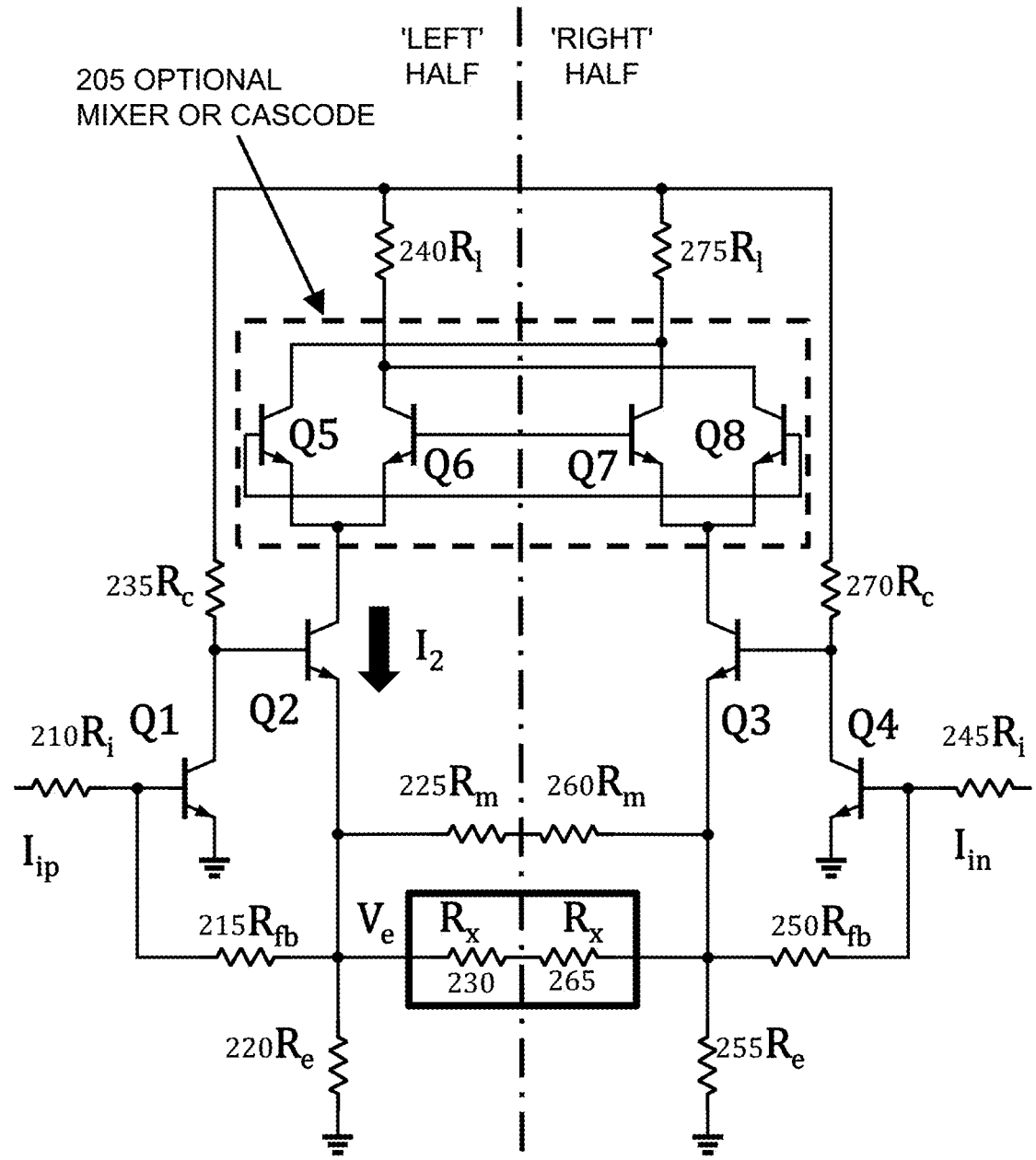
FIG. 2 is a schematic depicting a transimpedance amplifier in accordance with an embodiment.

FIG. 2 is a schematic 200 depicting an embodiment showing the components that determine the gain of the TIA. As in FIG. 1, an optional mixer or cascode 205 is included. Equations for gain calculation include:

Here, equations for gain calculation include:

$$V_e = \frac{R_{fb}}{R_i} * V_i \quad (EQ1)$$

and $$I_2 = V_e * \left(\frac{1}{R_e} + \frac{1}{R_m} + \frac{1}{R_{fb}} + \frac{1}{R_x}\right) = \frac{R_{fb}}{R_i} * (S_e + S_m + S_{fb} + S_x) \quad (EQ5)$$

and $V_o = 0.5 * I_2 * R_l$ (EQ3)

$$\frac{V_o}{V_i} = \frac{0.5 * Rfb * Rl}{R_i} * (S_e + S_m + S_{fb} + S_x) \quad (EQ6)$$

where $S_x = S_{fbmax} - S_{fb}$ (EQ7)

and $$\frac{V_o}{V_i} = \frac{0.5 * Rfb * Rl}{R_i} * (S_e + S_m + S_{fb} + S_{fbmax} - S_{fb}) \quad (EQ8)$$

and therefore Gain equals:

$$\frac{V_o}{V_i} = \frac{0.5 * Rfb * Rl}{R_i} * (S_e + S_m + S_{fbmax}) \quad (EQ9)$$

Again, where the values of 0.5 in Equations 3, 6, 8, and 9 represent the contribution of an optional mixer, where the mixer splits the energy in half, sending half to one sideband frequency, and the other half to another sideband. The cascode preserves the energy, and is used to improve the output impedance.

Substituting (EQ7) into (EQ6), where $+S_{fb}$ and $-S_{fb}$ cancel (EQ8), gives (EQ9) for the Gain. Duplicating and inverting the resistance value in a different location in the circuit counteracts the effect of one of the sides of the equation. Embodiments take the resistor out of part of the equation, extending the range.

Here, duplicating and inverting ($1/R_x$ in (EQ5)) the gain-calculation resistance value by the first and second $R_x$ resistors located between the first and second $R_i$ resistors counteracts the effects of response, bandwidth, peaking, overshoot, noise, and SNR variables. It adjusts the gain, affecting the input impedance by less than about 10%, and does not require additional attenuators.

The circuit comprises a 'left' half comprising a first $R_i$ resistor 210 in electrical connection with a base of a transistor Q1 and a first $R_{fb}$ resistor 215. First $R_{fb}$ resistor 215 is in electrical connection with a first $R_e$ resistor 220, a first resistor 225, a first $R_x$ resistor 230, and an emitter of a transistor Q2. First $R_e$ resistor 220 is also in electrical connection with the ground. Emitter of transistor Q1 is also in electrical connection with the ground. Collector of transistor Q1 is in electrical connection with a base of transistor Q2 and a first $R_c$ resistor 235. First $R_c$ resistor 235 is also in electrical connection with a first $R_l$ resistor 240.

The optional mixer or cascode 205 comprises transistors Q5-Q8.

In embodiments comprising the optional mixer or cascode 205, a collector of transistor Q2 is in electrical communication with an emitter of a transistor Q5 and with an emitter of a transistor Q6. A collector of the transistor Q6 is also in electrical communication with the first $R_l$ resistor 240, opposite the end in electrical connection with the first $R_c$ resistor 235.

The circuit 'right' half comprises a second $R_i$ resistor 245 in electrical connection with a base of a transistor Q4 and a second $R_{fb}$ resistor 250. Second $R_{fb}$ resistor 250 is in electrical connection with a second $R_e$ resistor 255, a second $R_m$ resistor 260, a second $R_x$ resistor 265, and an emitter of a transistor Q3. Second $R_e$ resistor 255 is also in electrical connection with the ground. Emitter of transistor Q4 is also in electrical connection with the ground. Collector of transistor Q4 is in electrical connection with a base of transistor Q3 and a second $R_c$ resistor 270. Second $R_c$ resistor 270 is also in electrical connection with a second $R_I$ resistor 275.

Further, the left half and right half are in electrical communication between the first $R_x$ resistor 230 and the second $R_x$ resistor 265, and between the first $R_m$ resistor 225, and the second $R_m$ resistor 260.

In embodiments comprising the optional mixer or cascode 205, for the 'right' half, a collector of transistor Q3 is in electrical communication with an emitter of a transistor Q8 and with an emitter of a transistor Q7. A collector of the transistor Q7 is also in electrical communication with the second $R_I$ resistor 275, opposite the end in electrical connection with the second $R_c$ resistor 270.

Again, further, in embodiments comprising the optional mixer or cascode 205, the left half and right half are in electrical communication between a base of transistor Q6 and a base of transistor Q7, a base of transistor Q5 and a base of transistor Q8, a collector of Q6 and a collector of Q8, and a collector of Q5 and a collector of Q7. $I_2$ is the total current flowing to the output of the circuit that passes through the optional mixer or cascade before creating output voltage $V_o$ (EQ 9). The feedback of the Transimpedance amplifier forces the voltage at $V_e$ to be equal to $R_{fb}/R_i*V_i$.

Embodiments are not limited to a particular type of transistor. Rather, the circuit can be implemented using any number of suitable transistor types. For example, the transistors Q1-Q8 can be implemented with CMOS FETs or Bipolar Junction Transistors, or any other suitable transistor technology.

Figure 3:
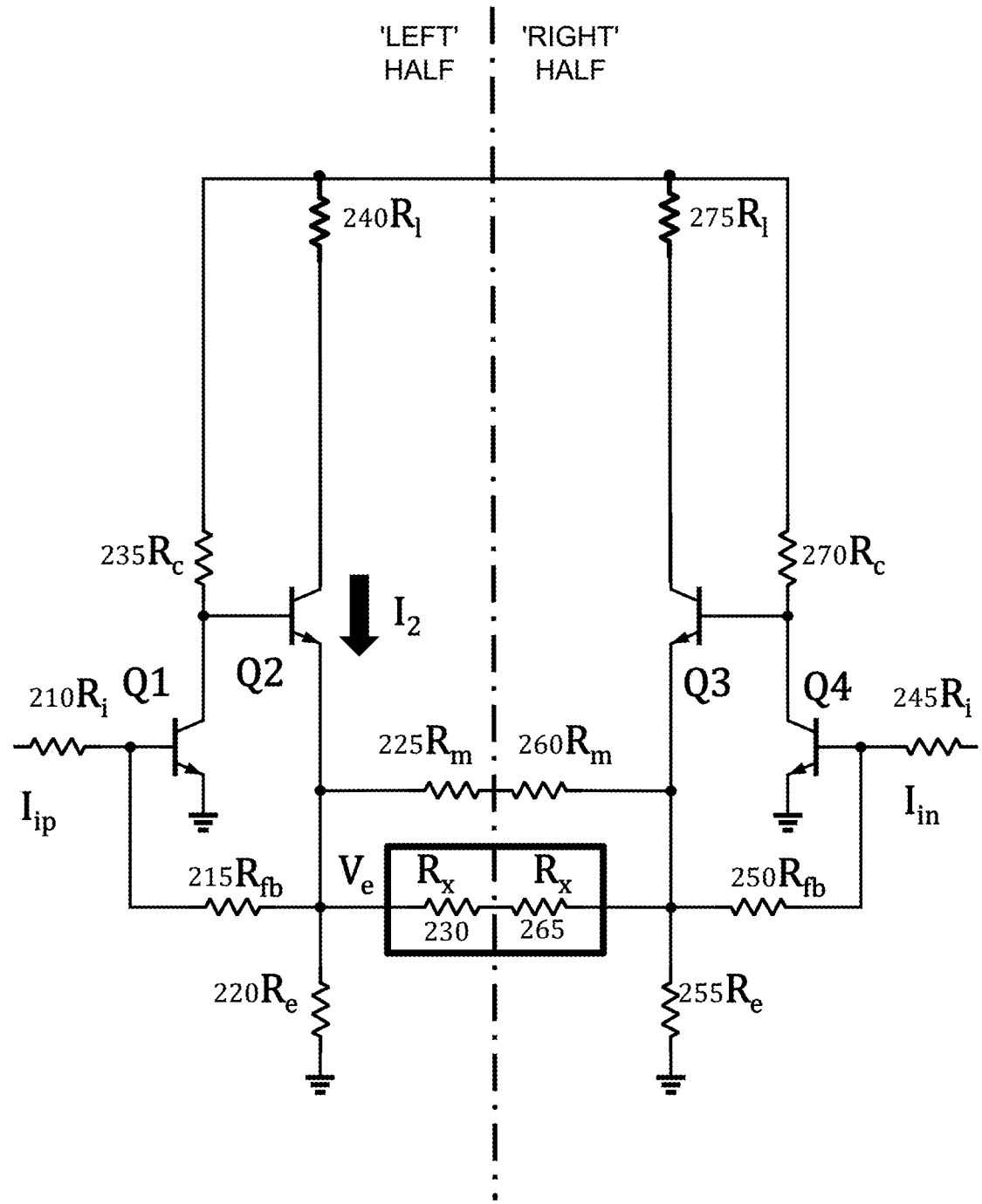
FIG. 3 is a schematic depicting a transimpedance amplifier in accordance with another embodiment.

FIG. 3 is an embodiment schematic 300 with no mixer or cascode. As with FIG. 2, the circuit comprises a 'left' half comprising a first $R_I$ resistor 210 in electrical connection with a base of a transistor Q1 and a first $R_{fb}$ resistor 215. First $R_{fb}$ resistor 215 is in electrical connection with a first $R_e$ resistor 220, a first $R_m$ resistor 225, a first $R_x$ resistor 230, and an emitter of a transistor Q2. First $R_e$ resistor 220 is also in electrical connection with the ground. Emitter of transistor Q1 is also in electrical connection with the ground. Collector of transistor Q1 is in electrical connection with a base of transistor Q2 and a first $R_c$ resistor 235. First $R_c$ resistor 235 is also in electrical connection with a first $R_I$ resistor 240. A collector of the transistor Q2 is in electrical communication with the end of the first $R_I$ resistor 240 opposite the end in electrical communication with the first $R_c$ resistor 235.

The circuit 'right' half comprises a second $R_I$ resistor 245 in electrical connection with a base of a transistor Q4 and a second $R_{fb}$ resistor 250. Second $R_{fb}$ resistor 250 is in electrical connection with a second $R_e$ resistor 255, a second $R_m$ resistor 260, a second $R_x$ resistor 265, and an emitter of a transistor Q3. Second $R_e$ resistor 255 is also in electrical connection with the ground. Emitter of transistor Q4 is also in electrical connection with the ground. Collector of transistor Q4 is in electrical connection with a base of transistor Q3 and a second $R_c$ resistor 270. Second $R_c$ resistor 270 is also in electrical connection with a second $R_I$ resistor 275. A collector of the transistor Q3 is in electrical communication with the end of the second $R_I$ resistor 275 opposite the end in electrical communication with the second $R_c$ resistor 270.

The left half and right half are in electrical communication between the first $R_x$ resistor 230 and the second $R_x$ resistor 265, and between the first $R_m$ resistor 225, and the second $R_m$ resistor 260.

Embodiments are applicable to a variety of amplifier and mixer designs. For example, heterodyne and homodyne transceivers that are both wideband and narrowband in frequency as well as any components for amplification of mixing that may appear in a transceiver.

FIG. 4 is a Table 400 presenting Gain as a function of resistor values. The following graphs depict this data. The initial value of $R_x$ is infinite, or no resistor, in this case. The first value of Rx is used after the first step in gain.

Figure 5:
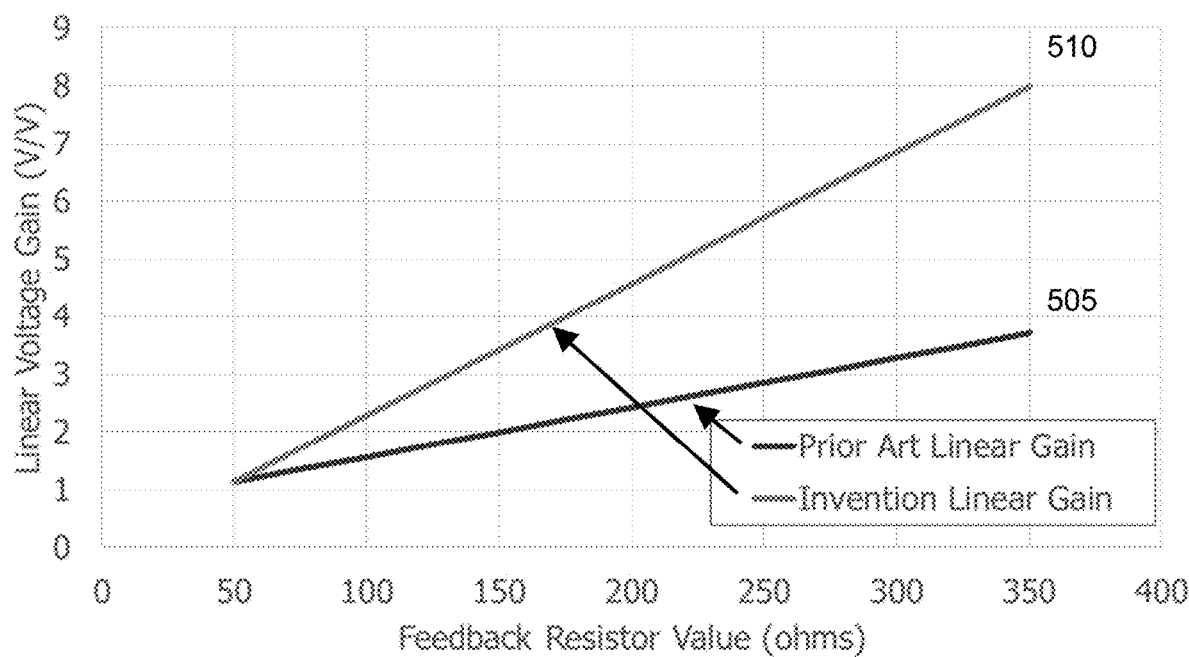
FIG. 5 is a graph of sample linear gain versus feedback resistor value configured in accordance with an embodiment.

FIG. 5 is a graph 500 of sample gain versus feedback resistor value from the data of Table of FIG. 4. Depicted are prior art linear gain 505 and embodiment linear gain 510. For a feedback resistor $R_{fb}$ value of 350 ohms, the linear voltage gain V/V is under 4 for the prior art, and 8 for an embodiment. In this embodiment, the invention gives more than double the usable attenuation range.

Figure 6:
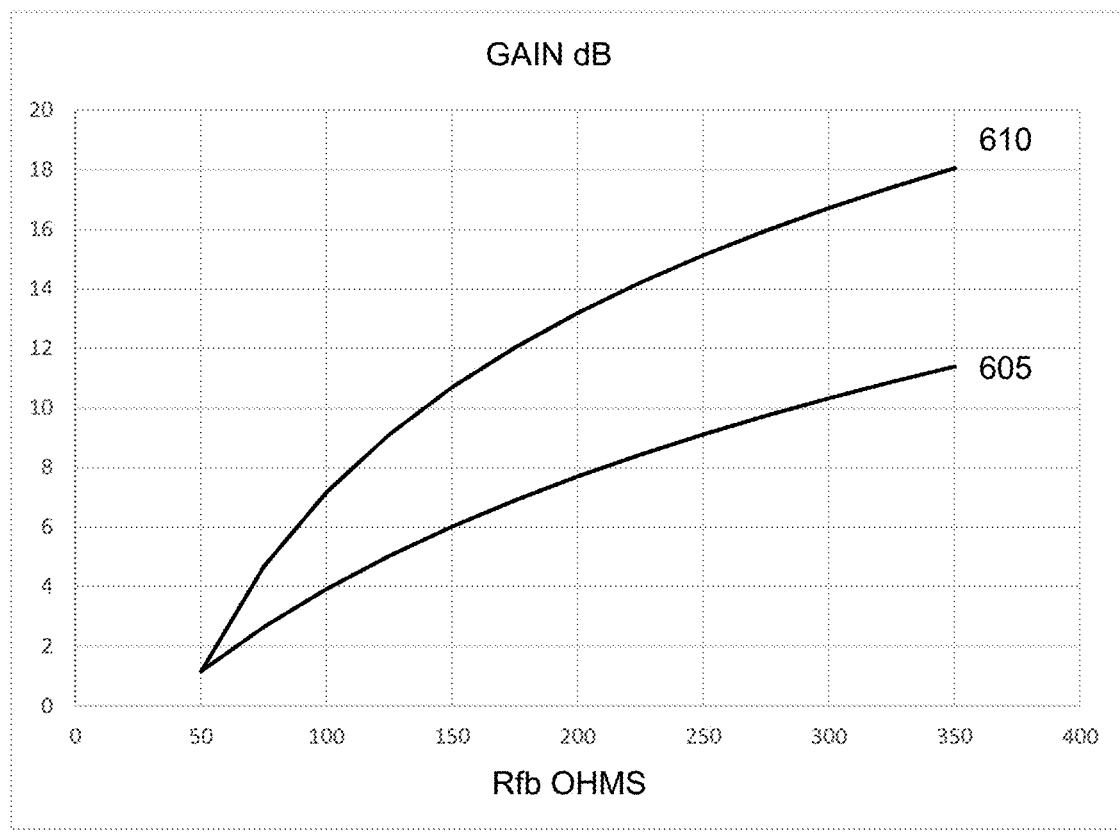
FIG. 6 is graph in dB of sample gain versus feedback resistor value configured in accordance with an embodiment.

FIG. 6 is a graph 600 of sample gain versus feedback resistor value presented in dB from the data of Table of FIG. 4. Depicted are prior art gain 605 and embodiment gain 610. For a feedback resistor $R_{fb}$ value of 350 ohms, for the prior art the gain under 12 dB, and 18 dB for an embodiment. In this embodiment, the invention gives more than 6 dB of usable attenuation range.

The diagrams in the Figures illustrate the architecture, functionality, and operation of possible implementations of systems according to various embodiments of the present invention.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A transimpedance amplifier device comprising:
a first circuit half and a second circuit half;
said first circuit half comprising:
a first $R_i$ resistor in electrical connection with a base of a transistor Q1 and a first $R_{fb}$ resistor; said first $R_{fb}$ resistor in electrical connection with a first $R_e$ resistor, a first $R_m$ resistor, a first $R_x$ resistor, and an emitter of a transistor Q2, said first $R_e$ resistor is also in electrical connection with a ground, an emitter of said transistor Q1 is also in electrical connection with said ground, a collector of said transistor Q1 is in electrical connection with a base of said transistor Q2 and a first $R_c$ resistor, first $R_c$ resistor is also in electrical connection with a first $R_l$ resistor, a collector of said transistor Q2 is in electrical communication with the end of said first $R_l$ resistor opposite the end in electrical communication with said first $R_c$ resistor;

said second circuit half comprising:
a second $R_i$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, said second $R_e$ resistor is also in electrical connection with said ground, an emitter of a transistor Q4 is also in electrical connection with said ground, a collector of said transistor Q4 is in electrical connection with a base of said transistor Q3 and a second $R_c$ resistor, said second $R_c$ resistor is also in electrical connection with a second $R_l$ resistor, a collector of said transistor Q3 is in electrical communication with the end of said second $R_l$ resistor opposite the end in electrical communication with said second $R_c$ resistor;

wherein a second $R_i$ resistor in electrical connection with a base of said transistor Q4 and a second $R_{fb}$ resistor, said second $R_{fb}$ resistor is in electrical connection with a second $R_e$ resistor, a second $R_m$ resistor, a second $R_x$ resistor, and an emitter of said transistor Q3, said second $R_e$ resistor is also in electrical connection with said ground, emitter of said transistor Q4 is also in electrical connection with said ground, a collector of said transistor Q4 is in electrical connection with a base of said transistor Q3 and a second $R_c$ resistor, said second $R_c$ resistor is also in electrical connection with a second $R_l$ resistor; and said first half and said second half are in electrical communication between said first $R_x$ resistor and said second $R_x$ resistor, and between said first resistor, and said second resistor.

2. The device of claim 1, wherein said gain is defined as:

$$\frac{V_o}{V_i} = \frac{Rfb * Rl}{R_i} * (S_e + S_m + S_{fbmax}).$$

3. The device of claim 1, wherein duplicating and inverting a gain-calculation resistance value by said first and second $R_x$ resistors located between said first and second $R_i$ resistors counteracts effects of response, bandwidth, peaking, overshoot, noise, and SNR variables; adjusts gain affecting an input impedance by less than about 10%; and does not require additional attenuators.

4. The device of claim 1, wherein said device is a component of a transceiver.

5. The device of claim 1, wherein said device is a component of a narrow band chipset.

6. The device of claim 1, wherein a resistance value of at least one of said first $R_x$ resistor and said second $R_x$ resistor is about 60 ohms.

7. The device of claim 1, wherein a value of each of said first and said second resistors $R_{fb}$ is about 350 ohms.

8. The device of claim 1, further comprising a mixer.

9. The device of claim 1 wherein said transistors are implemented with CMOS FETs or bipolar junction transistors.

10. A transimpedance amplifier device comprising:
a first circuit half, a second circuit half, and a mixer;
said first circuit half comprising:
a first $R_i$ resistor in electrical connection with a base of a transistor Q1 and a first $R_{fb}$ resistor; said first $R_{fb}$ resistor in electrical connection with a first $R_e$ resistor, a first $R_m$ resistor, a first $R_x$ resistor, and an emitter of a transistor Q2, said first $R_e$ resistor is also in electrical connection with a ground, an emitter of said transistor Q1 is also in electrical connection with said ground, a collector of said transistor Q1 is in electrical connection with a base of said transistor Q2 and a first $R_c$ resistor, first $R_x$ resistor is also in electrical connection with a first $R_l$ resistor;

said second circuit half comprising:
a second $R_i$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, said second $R_e$ resistor is also in electrical connection with said ground, an emitter of a transistor Q4 is also in electrical connection with said ground, a collector of said transistor Q4 is in electrical connection with a base of said transistor Q3 and a second $R_c$ resistor, said second $R_c$ resistor is also in electrical connection with a second $R_l$ resistor; and said mixer comprising:
transistors Q5, Q6, Q7, and Q8, wherein a base of said transistor Q6 and a base of said transistor Q7, a base of said transistor Q5 and a base of said transistor Q8, a collector of said transistor Q6 and a collector of said transistor Q8, and a collector of said transistor Q5 and a collector of said transistor Q7 are connected, a collector of said transistor Q3 is in electrical communication with an emitter of said transistor Q8 and with an emitter of said transistor Q7, a collector of said transistor Q7 is also in electrical communication with said second $R_l$ resistor, opposite the end in electrical connection with said second $R_c$ resistor.

11. The device of claim 10, wherein said gain is defined as:

$$\frac{V_o}{V_i} = \frac{0.5 * Rfb * Rl}{R_i} * (S_e + S_m + S_{fbmax}).$$

12. The device of claim 10, wherein duplicating and inverting a gain-calculation resistance value by said first and second $R_x$ resistors located between said first and second $R_i$ resistors counteracts effects of response, bandwidth, peaking, overshoot, noise, and SNR variables; adjusts gain affecting an input impedance by less than about 10%; and does not include additional attenuators.

13. The device of claim 10, wherein said device is a component of a heterodyne or homodyne transceiver.

14. The device of claim 10, wherein said device is a component of a wideband or a narrowband transceiver.

15. The device of claim 10, wherein:
a resistance value of each of said first and said second $R_e$ resistors is about 100 ohms;
a resistance value of each of said first and said second $R_i$ resistors is about 35 ohms;
a resistance value of each of said first and said second $R_{fb}$ resistors is about 75 ohms;

a resistance value of each of said first and said second $R_m$ resistors is about 500 ohms;

a resistance value of each of said first and said second $R_x$ resistors is about 150 ohms; and a resistance value of each of said first and said second $R_I$ resistors is about 50 ohms.

16. The device of claim 10, wherein a resistance value of each of said first and said second $R_{fb}$ resistors is about 350 ohms.

17. The device of claim 10, wherein a resistance value of each of said first and said second $R_x$ resistors is about 150 ohms.

18. The device of claim 10, wherein said transistors are implemented with CMOS FETs or bipolar junction transistors.

19. The device of claim 10, wherein said gain is doubled by increasing a value of each of said first and said second $R_{fb}$ resistors from about 50 ohms to about 350 ohms.

20. A transimpedance amplifier device comprising:

a first circuit half, a second circuit half, and a cascode;

said first circuit half comprising:

a first $R_I$ resistor in electrical connection with a base of a transistor Q1 and a first $R_{fb}$ resistor; said first $R_{fb}$ resistor in electrical connection with a first $R_e$ resistor, a first $R_m$ resistor, a first $R_x$ resistor, and an emitter of a transistor Q2, said first $R_e$ resistor is also in electrical connection with a ground, an emitter of said transistor Q1 is also in electrical connection with said ground, a collector of said transistor Q1 is in electrical connection with a base of said transistor Q2 and a first $R_c$ resistor, first $R_c$ resistor is also in electrical connection with a first $R_I$ resistor;

said second circuit half comprising:

a second $R_I$ resistor in electrical connection with a base of a transistor Q4 and a second $R_{fb}$ resistor, a second $R_{fb}$ resistor in electrical connection with a second $R_e$ resistor, a second $R_m$ resistor, a second $R_x$ resistor, and an emitter of a transistor Q3, said second $R_e$ resistor is also in electrical connection with said ground, an emitter of a transistor Q4 is also in electrical connection with said ground, a collector of said transistor Q4 is in electrical connection with a base of said transistor Q3 and a second $R_c$ resistor, said second $R_c$ resistor is also in electrical connection with a second $R_I$ resistor; and said cascode comprising:

transistors Q5, Q6, Q7, and Q8, wherein a base of said transistor Q6 and a base of said transistor Q7, a base of said transistor Q5 and a base of said transistor Q8, a collector of said transistor Q6 and a collector of said transistor Q8, and a collector of said transistor Q5 and a collector of said transistor Q7 are connected, a collector of said transistor Q3 is in electrical communication with an emitter of said transistor Q8 and with an emitter of said transistor Q7, a collector of said transistor Q7 is also in electrical communication with said second $R_I$ resistor, opposite the end in electrical connection with said second $R_c$ resistor.

\* \* \* \* \*